United States Patent

Rolker, Jr.

[15] 3,650,860

[45] Mar. 21, 1972

[54] METHOD OF MAKING PRINTED CIRCUITS

[72] Inventor: John H. Rolker, Jr., Monrovia, Calif.

[73] Assignee: Bell & Howell Company, Chicago, Ill.

[22] Filed: Aug. 22, 1968

[21] Appl. No.: 754,668

[52] U.S. Cl. ....................................156/3, 156/14, 156/345, 101/401.1, 117/17.5, 117/93.2

[51] Int. Cl. ....................H05k 1/00, H05k 3/06, B41n 3/02

[58] Field of Search ....................156/3, 345; 117/17.5, 93.2; 101/401.1

[56] References Cited

UNITED STATES PATENTS

| | | | |
|---|---|---|---|
| 3,011,436 | 12/1961 | Berry | 101/401.1 |
| 2,793,135 | 5/1957 | Sims et al. | 117/17.5 |
| 3,075,866 | 1/1963 | Baker et al. | 156/3 |
| 3,250,636 | 5/1966 | Wilferth | 117/17.5 |
| 3,472,695 | 10/1969 | Kaufer et al. | 117/238 |

*Primary Examiner*—Jacob H. Steinberg
*Attorney*—Raymond A. Andrew

[57] ABSTRACT

Printed circuits are made by a method which applies a dissoluble magnetizable layer to the electrically conductive coating of a circuit board blank. A magnetic image of the desired circuit is provided in the applied magnetizable layer and etchant-resistive magnetic toner is attracted by the magnetic image to form an etch resist pattern. The electrically conductive coating is then etched with the aid of an etchant and the latter etch resist pattern.

11 Claims, 5 Drawing Figures

INVENTOR.
JOHN H. ROLKER, JR.

INVENTOR.
JOHN H. ROLKER, JR.

METHOD OF MAKING PRINTED CIRCUITS

BACKGROUND OF THE INVENTION

This invention relates to the treatment of materials and, more particularly, to a method for selectively treating an object.

Many applications in industry require the selective treatment of objects. Examples of such applications are the selective doping or etching of semiconductors in the production of integrated circuits, and the etching of printing plates. In the electronics industry, one of the most important applications is the etching of copper layers on insulating boards in the production of printed circuits.

In the conventional method of fabricating printed circuits, the circuit pattern is photographically reproduced on the surface of a copper layer on the circuit board and the portions of the copper the pattern does not cover are removed by an etching agent. Specifically, a layer of a so-called photoresist is placed over the copper layer on the printed circuit board. A mask depicting the desired circuit pattern is placed over the layer of photoresist and the areas of the photoresist that remain uncovered by the mask are exposed to light. After the photoresist is developed and the unexposed portions thereof are washed off the copper layer, the circuit board is placed in an acid bath to remove the portion of the copper layer not covered by the photoresist. Finally, the remaining photoresist is stripped by a solvent, leaving the copper circuit pattern on the board.

The nature of the photographic process gives rise to certain requirements that are inconvenient in the production of printed circuit boards on a large scale. For example, the photoresist must be applied to the copper layer on the circuit board shortly before its exposure because photoresists are in general relatively instable to heat and light. If the circuit boards with the layer of photoresist are prepared in advance and stored, the danger exists that the photoresist will decompose. Further, darkened ambient conditions must be maintained in the work area where the photoresist is handled until after it is developed.

SUMMARY OF THE INVENTION

The subject invention presents a material improvement over the above-mentioned prior art and resides in a method of making a printed circuit with the aid of an etchant. According to the subject invention, this method comprises the combination of steps recited in the following paragraphs of this summary.

A circuit board is provided which has a base of electrically insulating material and a layer of etchable electrically conductive material located on the base. A dissoluble magnetizable layer is applied to the layer of conductive material. A magnetic image of the desired circuit is provided on the magnetizable layer.

A supply of etchant-resistive magnetic toner is provided, and toner from this supply is selectively attracted with the above mentioned magnetic image from the latter supply to the magnetizable layer to form on this magnetizable layer an etchant-resistive toner image of the desired circuit.

An etchant is thereupon applied to the toner image an to areas of the magnetizable layer which have been left exposed by the toner image. This dissolves the magnetizable layer at the exposed areas and etches portions of the layer of electrically conductive material below the exposed areas whereby the desired printed circuit is formed in the layer of electrically conductive material.

The applied etchant, the toner image, and remaining portions of the magnetizable layer are thereupon removed from the circuit board.

BRIEF DESCRIPTION OF THE DRAWINGS

The features of specific embodiments of the invention are illustrated in the drawings, in which.

DESCRIPTION OF SPECIFIC EMBODIMENTS

Figure 1:
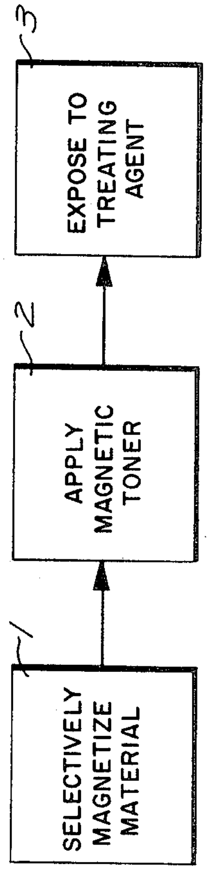
FIG. 1 is a block diagram representing in general terms the steps of the method for selectively treating areas of an object.

As illustrated in FIG. 1 by block 1, the first step in the method for selectively treating a material is to magnetize the material selectively so as to produce a magnetic pattern. Assuming specifically that the method is used to produce a circuit pattern on a printed circuit board, a layer of electrically conductive material such as copper is first deposited on the surface of the circuit board, which is conventionally made from an electrically insulative, acid-resistive plastic, and a layer of magnetizable material is then deposited on the conductive layer to provide a magnetizable surface. Although in practice, a separate layer of magnetizable material would generally be used to provide the magnetizable surface, the surface of the layer of conductive material could itself provide the magnetizable surface if a material is selected that is both conductive and magnetizable. The problem with using a single material, however, is that most magnetizable materials are not good enough electrical conductors for printed circuit boards. The magnetizable material could comprise a dispersion of chromium dioxide particles in acicular form in a polymer binder, such as an acetal resin, that is relatively soluble in an etching agent. The magnetizable material is selectively magnetized so that a group of magnetized areas is produced that corresponds to the desired circuit pattern. Preferably, the magnetizable surface is selectively magnetized by thermoremanent magnetization techniques disclosed in U.S. Pat. No. 3,541,577, by James U. Lemke, issued Nov. 17, 1970 to the subject assignee. Such techniques permit the creation of a circuit pattern having high resolution.

After the selective magnetization of the material, a magnetic toner is applied thereto as represented in block 2. The magnetic toner, which is impervious to the etching agent, could comprise fine particles of ferromagnetic material dispersed in a binder, such as high-density polyvinyl chloride, that is resistive to the acid used as the etching agent. The magnetic toner is suspended in a solvent for high-density polyvinyl chloride such as methyl ethyl ketone and the resulting solution is applied to the magnetizable surface of the circuit board. The solution adheres to the magnetized areas of the magnetizable surface and runs off the unmagnetized areas. Therefore, after the solvent has evaporated, the magnetic toner forms an acid-resistive cover over the magnetized portions of the magnetizable surface, leaving the unmagnetized portions uncovered and therefore vulnerable to the acid. Instead of applying a liquid magnetic toner, a dry magnetic toner in powdered form could be used.

After application of the magnetic toner thereto, the magnetizable surface is exposed to the treating agent as represented by block 3. The circuit board is treated with an etching agent, which could be nitric acid. The acid could be applied by dipping the entire circuit board in an acid bath. The acid dissolves and removes the magnetic material and the conductive material on the areas of the circuit board left uncovered by the magnetic toner, i.e., the complementary areas of the desired circuit pattern. Then, the magnetic toner and the magnetic material are stripped from the circuit board, leaving the layer of the conductive material in the form of the desired circuit pattern. The stripping agent is a solvent such as methyl ethyl ketone in which both the polymer binder for the magnetic material and the binder of the magnetic toner are soluble. The stripping agent is preferably applied to the circuit board by means of a conventional vapor degreasing bath so as to preserve the high resolution of the circuit pattern. Alternatively, separate stripping agents could be employed to remove the magnetic toner and the magnetic material.

Figures 2, 3:
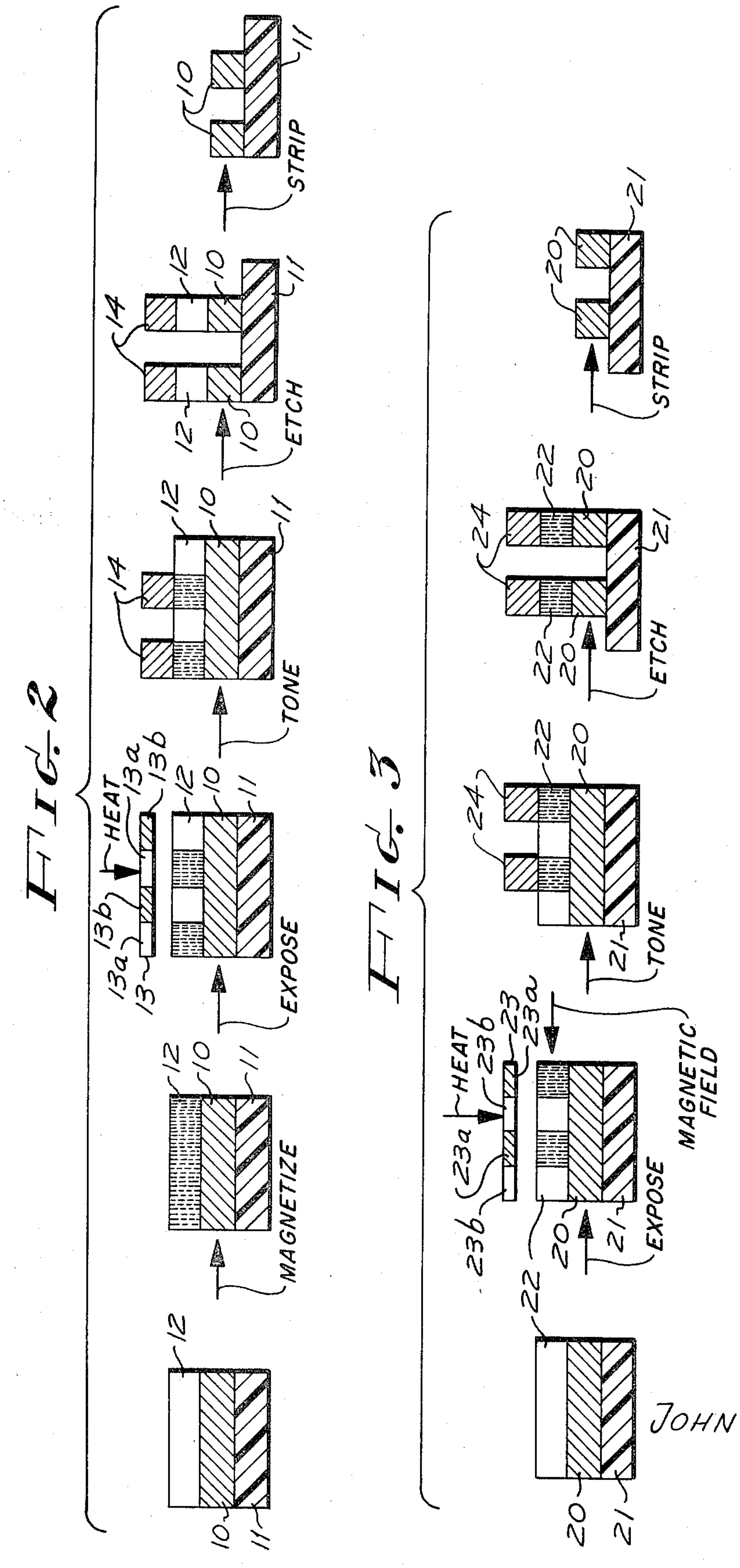
FIGS. 2 through 5 are diagrams depicting specifically alternative embodiments of the method represented in FIG. 1.

In FIG. 2, the steps of a specific embodiment of the method represented generally in FIG. 1 are depicted schematically moving from left to right. A layer 10 of copper is deposited on one surface of a plastic circuit board 11. A layer 12 of chromium dioxide dispersed in a binder is deposited over layer 10 to provide the magnetizable surface. First, layer 12 is uniformly magnetized, which is depicted by the vertical dashed lines in layer 12. Secondly, layer 12 is exposed to a master 13 having areas 13*a* that define the desired circuit pattern and complementary areas 13*b*. Good heat transfer takes place through areas 13*b*, which could be blackened to absorb heat or rendered transparent to transmit heat radiations to the layer 12, and poor heat transfer takes place through areas 13*a*, which could be lightened to reflect heat radiations. Heat is applied to the surface of master 13 facing away from layer 12, so that the temperature of layer 12 under areas 13*b* rises above the Curie point of the chromium dioxide but the temperature of layer 12 under areas 13*a* remains below the Curie point of the chromium dioxide. Thus, the portions of layer 12 corresponding to areas 13*b* are selectively demagnetized to leave the desired magnetic pattern in the portions corresponding to the areas 13*a*.

Thirdly, an acid-resistive magnetic toner 14 is applied to layer 12. Magnetic toner 14 adheres only to the magnetized portions of layer 12, leaving the unmagnetized portions uncovered. Fourthly, the circuit board 11 is immersed in an acid bath to etch the portions of layers 12 and 10 not covered by toner 14. Finally, magnetic toner 14 and the remaining portions of layer 12 are stripped from circuit board 11, leaving only layer 10 in the form of the circuit pattern determined by master 13.

In FIG. 3, the steps of another specific embodiment of the method represented generally in FIG. 1 are depicted schematically moving from left to right. A layer 20 of copper is deposited on one surface of a plastic circuit board 21. A layer 22 of chromium dioxide dispersed in a binder is deposited over layer 20 to provide the magnetizable surface. First, layer 22 is exposed to a master 23 having areas 23*a* that define the desired circuit pattern and complementary areas 23*b*. Good heat transfer takes place through areas 23*a* and poor heat transfer takes place through areas 23*b*. Master 23 is placed over layer 22 and heat is applied to the surface of master 23 facing away from layer 22, so that the portions of layer 22 under areas 23*a* rise to a temperature above the Curie point of the chromium dioxide and the portions of layer 22 under areas 23*b* rise to a temperature substantially less than the Curie point of the chromium dioxide. To take advantage of the principles of thermoremanent magnetization discussed, for instance, in the above mentioned Lemke application, the layer 22 is thereupon permitted to cool in the presence of a magnetic field until the portions of the layer under areas 23*a* become selectively magnetized without magnetization of the portions under areas 23*b*. The vertical dashed lines in layer 22 depict the magnetized portions thereof. Secondly, an acid-resistive magnetic toner 24 is applied to layer 22. Magnetic toner 24 adheres only to the magnetized portions of layer 22, leaving the unmagnetized portions uncovered. Thirdly, circuit board 21 is immersed in an acid bath to etch the portions of layers 22 and 20 not covered by toner 24. Finally, magnetic toner 24 and the remaining portions of layer 22 are stripped from circuit board 21, leaving only the portions of layer 20 in the form of the circuit pattern determined by master 23.

Figures 4, 5:
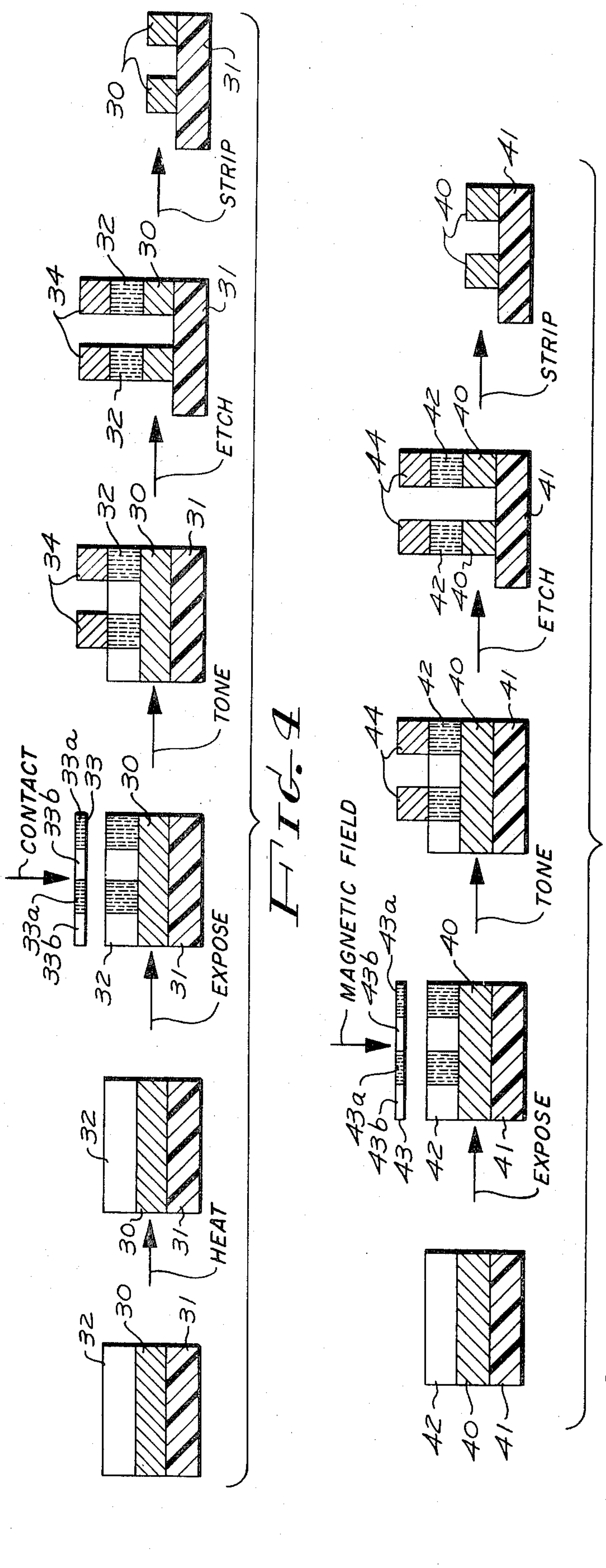

In FIG. 4, the steps of another specific embodiment of the method represented generally in FIG. 1 are depicted schematically moving from left to right. A layer 30 of copper is deposited on one surface of a plastic circuit board 31. A layer 32 of chromium dioxide dispersed in a binder is deposited over layer 30 to provide the magnetizable surface. First, layer 32 is uniformly heated to raise it to a temperature above the Curie point of the chromium dioxide. Secondly, layer 32 is exposed to a master 33, which is a magnetic medium such as tape that bears a magnetic pattern. Such master medium has a higher Curie point than the layer 32. Master 33 has magnetized areas 33*a* that define the desired circuit pattern and complementary unmagnetized areas 33*b*. Master 33 is placed in contact with layer 32 which is thereupon permitted to cool in the presence of the magnetic record on the master 33, until such record has been copied on the layer 32 by thermoremanent magnetization. The resulting selectively magnetized portions of master 33 and layer 32 are depicted by vertical dashed lines. Thirdly, an acid-resistive magnetic toner 34 is applied to layer 32. Magnetic toner 34 adheres only to the magnetized portions of layer 32, leaving the unmagnetized portions uncovered. Fourthly, circuit board 31 is immersed in an acid bath to etch the portions of layers 32 and 30 not covered by magnetic toner 34. Finally, magnetic toner 34 and the remaining portions of layer 32 are stripped from circuit board 31, leaving only layer 30 in the form of the circuit pattern determined by master 33.

In FIG. 5, the steps of another specific embodiment of the method represented generally in FIG. 1 are depicted schematically moving from left to right. A layer 40 of copper is deposited on one surface of a plastic circuit board 41. A layer 42 of gamma-ferric oxide dispersed in a binder is deposited over layer 40 to provide the magnetizable surface. First, layer 42 is exposed to a master 43 having magnetized areas 43*a* that define the desired circuit pattern and complementary unmagnetized areas 43*b*. Master 43 is a sheet composed of particles of a material, such as chromium dioxide, which has a higher coercivity than the gamma-ferric oxide, dispersed in a binder. Master 43 is placed in direct contact with layer 42 and a small alternating magnetic field, for example, about 300 oersteds alternating at 60 cycles per second, is applied to master 43 and layer 42, so that the magnetic pattern is transferred to layer 42 without destruction of the pattern stored on master 43. Secondly, an acid-resistive magnetic toner 44 is applied to layer 42. Magnetic toner 44 adheres only to the magnetized portions of layer 42, leaving the unmagnetized portions uncovered. Thirdly, circuit board 41 is immersed in an acid bath to etch the portions of layers 42 and 40 not covered by magnetic toner 44. Finally, magnetic toner 44 and the remaining portions of layer 42 are stripped from circuit board 41, leaving only layer 40 in the form of the circuit pattern determined by master 43.

Instead of treating the magnetizable surface with an etching agent as described in connection with FIGS 2 through 5, other types of treating agents could be employed. For example, the invention could be used in the fabrication of integrated circuits for selectively doping a semiconductive material. The magnetic toner would be made from a material that is impervious to the doping agent employed. In other words, the magnetic toner serves as a mask to prevent the treating agent from affecting the material to be treated under the areas covered by the magnetic toner.

I claim:

1. In a method of making a printed circuit with the aid of an etchant, the improvement comprising in combination the steps of:

providing a circuit board having a base of electrically insulating material and a layer of electrically conductive material etchable by said etchant and located on said base;

applying to said layer of electrically conductive material a magnetizable layer dissoluble by said etchant;

providing on said magnetizable layer a magnetic image of said circuit;

providing a supply of magnetic toner resistive to said etchant;

selectively attracting with said magnetic image magnetic toner from said supply to said magnetizable layer to form on said magnetizable layer an etchant-resistive toner image of said circuit;

applying said etchant to said toner image and to areas of said magnetizable layer left exposed by said toner image to dissolve said magnetizable layer at said exposed areas and to etch portions of said layer of electrically conductive material below said exposed areas whereby said printed circuit is formed in said layer of electrically conductive material; and removing said etchant, said toner image, and remaining portions of said magnetizable layer from said circuit board.

2. A method as claimed in claim 1, wherein said magnetic toner is composed of a magnetizable substance and a material resisting attack by said etchant.

3. A method as claimed in claim 1, wherein said magnetic toner includes magnetizable particles having shells of a material resisting attack by said etchant.

4. A method as claimed in claim 1, wherein said magnetic image is provided by premagnetizing said magnetizable layer and selectively demagnetizing portions of said premagnetized layer.

5. A method as claimed in claim 4, wherein said portions of said premagnetized layer are demagnetized by heating said portions of said premagnetized layer to above the Curie temperature of said premagnetized layer.

6. A method as claimed in claim 1, wherein said magnetic image is provided by thermoremanent magnetization of selected portions of said magnetizable layer.

7. A method as claimed in claim 1, wherein said thermoremanent magnetization includes the steps of heating said selected portions of said magnetizable layer to above the Curie temperature of said magnetizable layer, and cooling said heated portions in the presence of an external magnetic field.

8. A method as claimed in claim 1, wherein said magnetic image is provided by preparing a master record of said magnetic image, and magnetically copying said master record on said magnetizable layer.

9. A method as claimed in claim 8, wherein said master record is copied on said magnetizable layer by thermoremanent magnetization in the presence of said master record.

10. A method as claimed in claim 9, wherein said thermoremanent magnetization includes the steps of heating said magnetizable layer to above its Curie temperature and cooling said heated magnetizable layer in the presence of said master record.

11. A method as claimed in claim 8, wherein said master record is copied on said magnetizable layer by the steps of providing anhysteretic transfer fields, and subjecting said magnetizable layer to said master record and said anhysteretic transfer fields.

* * * * *